(12) United States Patent
Shepard

(10) Patent No.: US 8,378,456 B1
(45) Date of Patent: Feb. 19, 2013

(54) UNIFIED SWITCH ARRAY FOR MEMORY DEVICES

(75) Inventor: Daniel Robert Shepard, North Hampton, NH (US)

(73) Assignee: Contour Semiconductor, Inc., No. Billerica, MA (US)

( * ) Notice: Subject to any disclaimer, the term of this patent is extended or adjusted under 35 U.S.C. 154(b) by 0 days.

(21) Appl. No.: 13/199,437

(22) Filed: Aug. 30, 2011

Related U.S. Application Data

(60) Provisional application No. 61/402,436, filed on Aug. 30, 2010.

(51) Int. Cl.
*H01L 29/02* (2006.01)

(52) U.S. Cl. ............... 257/563; 257/564; 257/E27.046; 257/E27.053

(58) Field of Classification Search ................. 257/563, 257/564, E27.046, E27.053, E27.055, E27.072
See application file for complete search history.

(56) References Cited

U.S. PATENT DOCUMENTS

2010/0110753 A1* 5/2010 Slesazeck et al. ............ 365/145

* cited by examiner

*Primary Examiner* — Zandra Smith
*Assistant Examiner* — Paul Patton

(57) ABSTRACT

An array of vertically constructed, electronic switches is disclosed having three, four or more contacts and having a common bottom contact and a plurality of common middle contacts. This switch array will find use in memory devices or display devices.

20 Claims, 20 Drawing Sheets

UNIFIED SWITCH ARRAY FOR MEMORY DEVICES

CROSS-REFERENCE TO RELATED APPLICATION

This application claims priority to U.S. Provisional Patent Application No. 61/402,436 that was filed on Aug. 30, 2010 and that application is incorporated herein in its entirety by reference. This application also makes reference to and incorporates herein by reference in its entirety U.S. patent application Ser. No. 12/720,843, by Shepard titled "Vertical Switch Three-Dimensional Memory Array" that was filed on Mar. 10, 2010 and U.S. patent application Ser. No. 13/135,235, by Shepard titled "Means and Method for Operating a Resistive Array" that was filed on Jun. 29, 2011.

TECHNICAL FIELD

In various embodiments, the present invention relates to arrays of switches as they relate to memory devices, and more particularly to arrays of transistors arrayed in one or two or more dimensions and that have a high packing density for use in memory devices.

BACKGROUND

High density memory arrays typically are arranged in rows and columns having a memory cell element at the points of intersection (between the row and column) whereby one of either the rows conductors layer or columns conductors layer is layered above the other and is formed using metal material. In so much as metal is considerably more conductive than a doped semiconductor material, it is the material of choice for both the rows and columns. However, manufacturing considerations come into play when using a metal material for the bottom conductors layer because forming the memory cell element (prior to forming the top conductors layer) typically utilizes factory equipment that can become contaminated by the presence of metal. One solution can be to have dedicated equipment that is frequently cleaned, but this equipment is expensive and such an approach can be economically impractical. Another solution, as mentioned above, is to use a material other than metal (e.g., doped semiconductor material) for the bottom conductors layer, but because of the higher resistivity of such materials, performance of the final device can be compromised. What is needed is a design that can use higher resistance semiconductor material for the bottom conductors layer that compensates for the degraded performance.

SUMMARY

The present invention is a memory array switch design that incorporates a switch at each memory cell location where the switch has gain that enables that switch to be operated using much lower current so as to compensate for the higher resistance conductors layer that controls that switch. In particular, the switch element is a bipolar transistor (either a PNP or an NPN) that is vertically constructed (for high packing density, but could sacrifice packing density and be constructed horizontally or partially horizontally) on a common bottom terminal contact (either the collector or the emitter) and with the base controlled by a buried, shared conductors layer having higher resistivity than a typical semiconductor fabrication metal (such as aluminum, tungsten, or copper) and where the third terminal on top of the switch is independently connected to an information storage element (such as a phase-change material, a resistive change material, or any other two terminal storage element) that is connected to an top conductors layer (orthogonal to the buried, shared conductors layer connected to the base terminals).

In operation, a memory cell is selected by energizing the bottom terminal contact along with the selection of one conductor from the buried, shared conductors layer connected to the base terminals (this activates one line of switches) and selecting one conductor from the top (orthogonal) conductors layer. The selected memory cell is located at the intersection of the one conductor from the buried, shared conductors layer connected to the base terminals with the one conductor from the top conductors layer. Resistance of materials in the field of semiconductors is typically expressed in squares of that material, as is well understood by those skilled in the art. The common bottom terminal contact is essentially a single square (that is the size of the whole array) of a bottom semiconductor material of the bipolar switches and, as such, has the low resistance of a single square of material (as opposed to the high resistance of a long, thin conductor connecting the bottoms of one selected line connecting a line of switches). The conductor for actually selecting the one line of switches connects to the base terminals of that line of switches and this conductor does indeed have higher resistance, but because this conductor connects to the base terminal of the bipolar switches, only a low current is required (in other words, the higher resistance of this conductor has less of an impact because less current is required to drive the base terminal of the bipolar switch and because with lower current running through the conductor, the voltage drop along the length of the conductor is less severe). This lower current running through the base terminal is compensated for by the gain of the bipolar switch thereby enabling the necessary (greater) current to flow through the information storage element and the top terminal.

For example, if the bipolar switches are of the PNP type and the bottom terminal contact is the collector of all of these PNP's (and this common collector contact is grounded), a memory cell would be selected by applying a positive voltage to one column conductor on the top of the array (connecting through an information storage element to the respective emitter of the bipolar switches below that selected column conductor) and grounding one orthogonal row conductor (connecting to a row of bipolar switch base terminals). The selected memory cell would have a current path through it that would begin at the positive voltage source of the column selection circuit, through the (low resistance metal) selected column, through the information storage element, into the emitter of the bipolar switch and out the (low resistance, single square) common collector contact; this entire path is of a lower resistance. Also, a small portion (only) of that current, as determined by the beta of the bipolar switch, would flow out the base terminal to the higher resistance, selected row conductor.

The present invention is a means for forming an array of memory cell switches whereby the current path through the switch has lower resistance and the buried conductors layers are non-metals thereby enabling fabrication to be done without process equipment contamination concerns.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, an embodiment of the present invention is described with reference to the following drawing, in which.

DETAILED DESCRIPTION

The unified switch array according to the present invention can be fabricated using standard techniques and equipment. With this approach, bipolar transistors are fabricated in a vertical orientation having a single common bottom terminal (shared in two dimensions) and, along one dimension, a plurality of lines extending in the orthogonal direction along each of which can be found base terminals of a given row of transistors.

Figure 1:
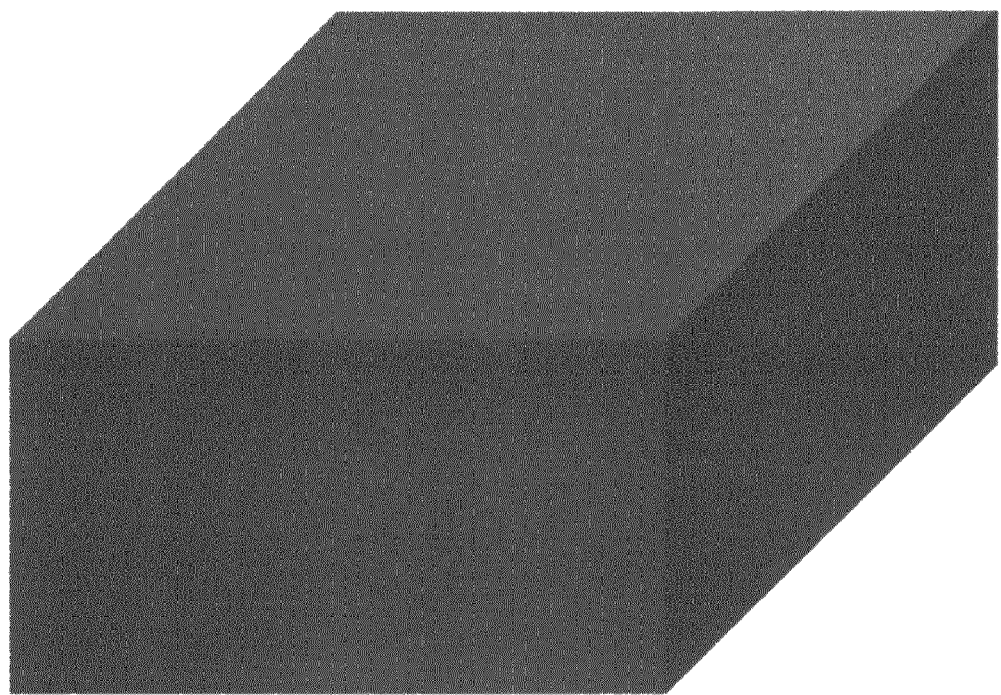
FIG. 1 is an exemplary drawing of a semiconductor surface following a first dopant implant in accordance with an embodiment of the invention.
Figure 2:
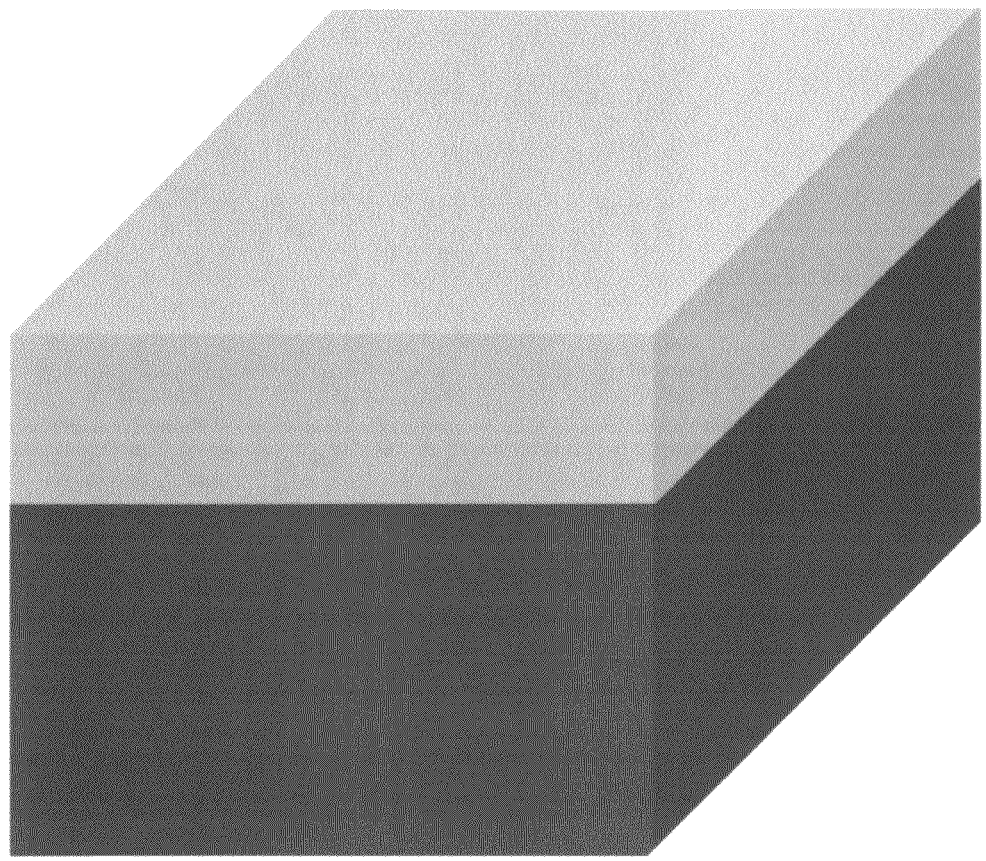
FIG. 2 is an exemplary drawing of a semiconductor surface following deposition of a first dielectric layer in accordance with an embodiment of the invention.
Figure 3:
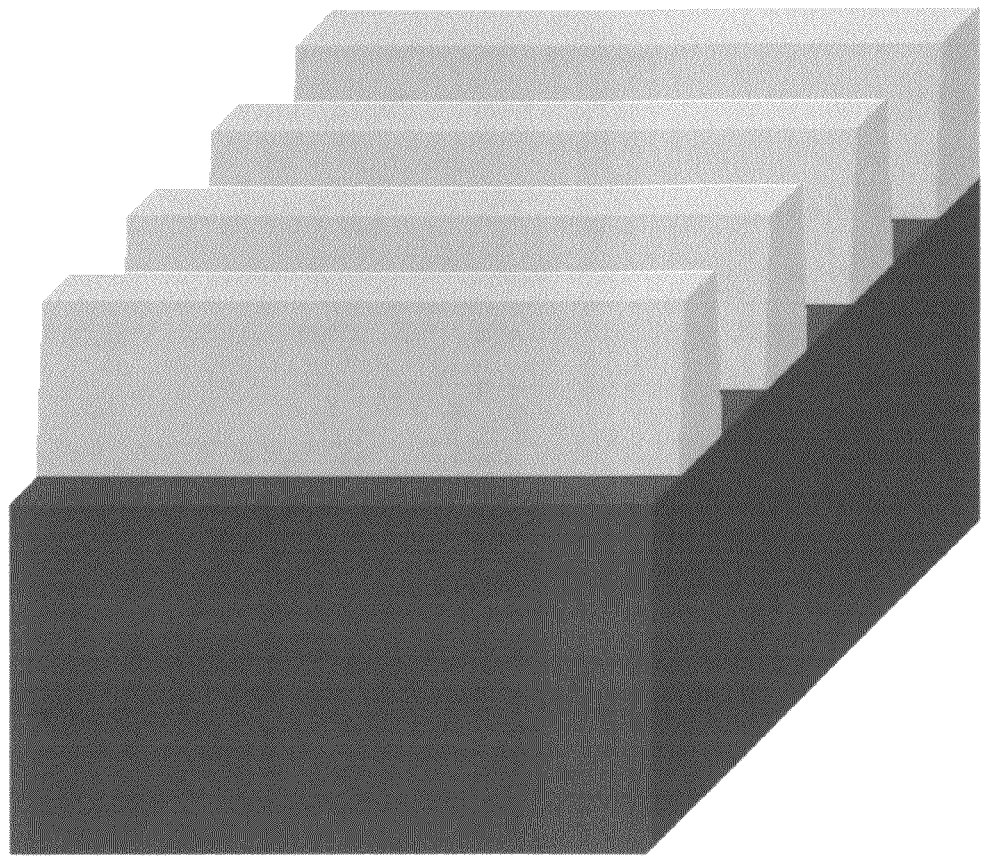
FIG. 3 is an exemplary drawing of a semiconductor surface following etching of the base conductor channels in accordance with an embodiment of the invention.
Figure 4:
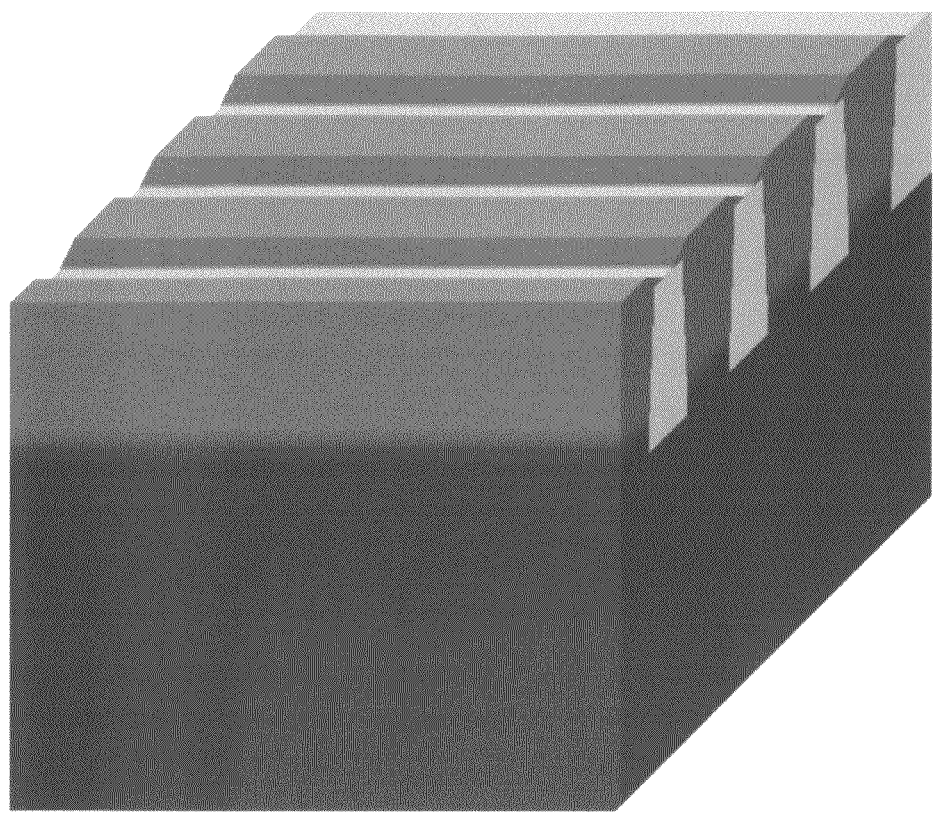
FIG. 4 is an exemplary drawing of a semiconductor surface following epitaxial growth of the base material in accordance with an embodiment of the invention.
Figure 5:
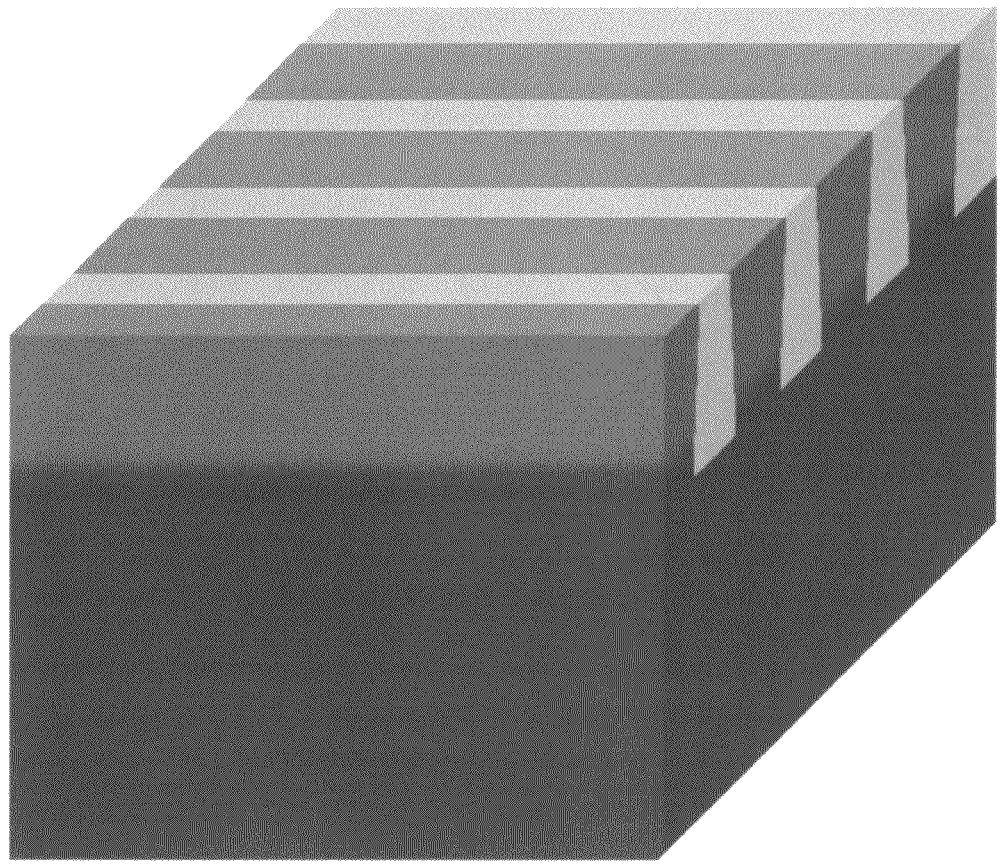
FIG. 5 is an exemplary drawing of a semiconductor surface following planarization of the surface in accordance with an embodiment of the invention.

Fabrication begins with an area of silicon substrate in which the silicon is doped. This area will be the common emitter or collector of a PNP or an NPN bipolar transistor, as desired and as further explained below. As such and as required by the kind of transistor being built, the polarity—P-type or N-type—and the concentration of the doping is done consistent with the type of bipolar transistor being fabricated and its orientation (emitter on top or on bottom), and this doping is well understood by those skilled in the art. This common area can be the base layer in the substrate or a reverse doped layer can be formed below this area to generally isolate the area from the rest of the substrate (i.e., an isolation well). Once the common area is doped as depicted in FIG. 1, a dielectric layer is deposited as shown in FIG. 2. This dielectric layer has a thickness approximately equal to the desired thickness of the base region. Once the base region dielectric layer is deposited, this layer is patterned and etched to form trenches where the transistor base material is to be, as depicted in FIG. 3. These trenches are etched to the surface of the underlying doped silicon common area (depicted in FIG. 1) so as to expose the surface of that doped silicon in the bottom of the trenches. Silicon is now deposited by selectively epitaxially growing on the exposed silicon in the bottom of the trenches as is commonly done by those skilled in the art and as is depicted in FIG. 4. FIG. 5 depicts the structure following planarization (as by CMP).

It should be noted that the structure depicted in FIG. 5 can be achieved in other ways as will be well understood by those skilled in the art as can other structured formed according to the present invention. For example, the structure depicted in FIG. 5 could have been formed by implanting a shallower base layer on top of the deeper common area and then etching away the shallower base layer material between the stripes of remaining base layer; this would be followed by deposition of dielectric to fill between the stripes of base layer material and planarization.

Figure 6:
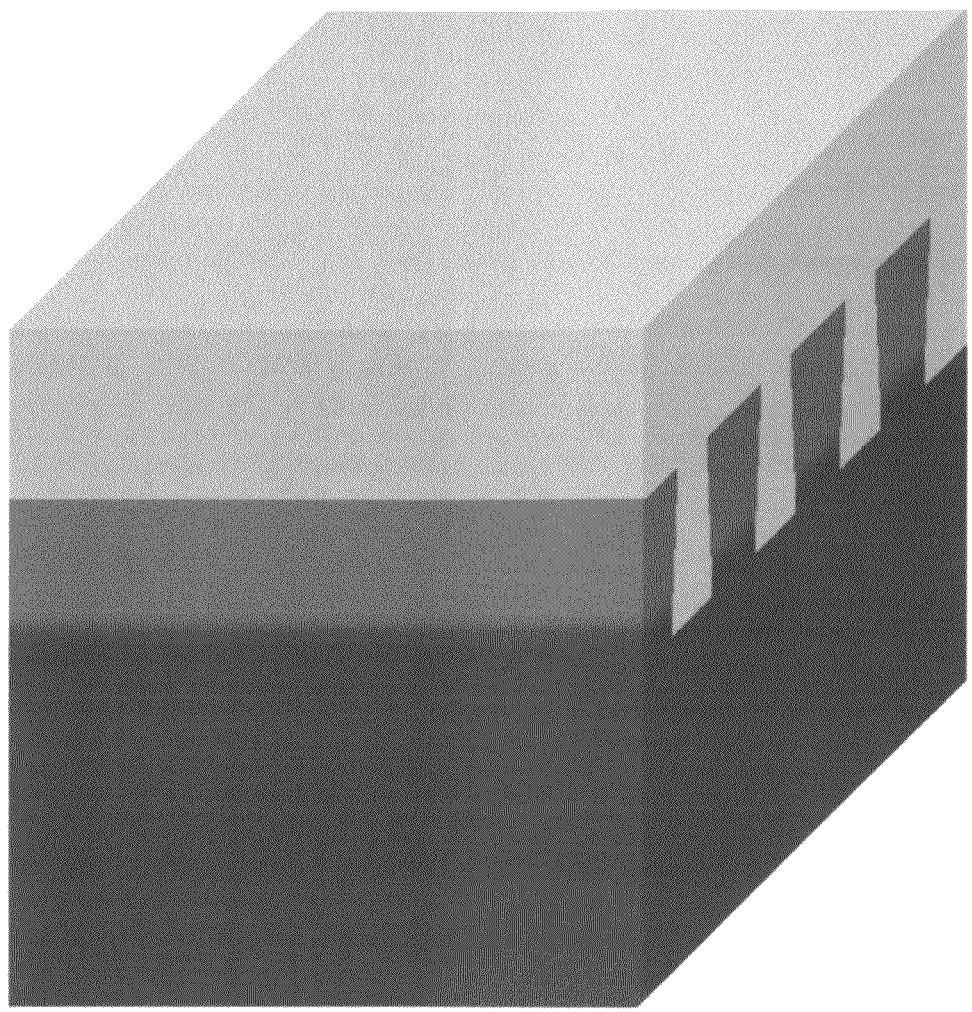
FIG. 6 is an exemplary drawing of a semiconductor surface following deposition of a second dielectric layer in accordance with an embodiment of the invention.
Figure 7:
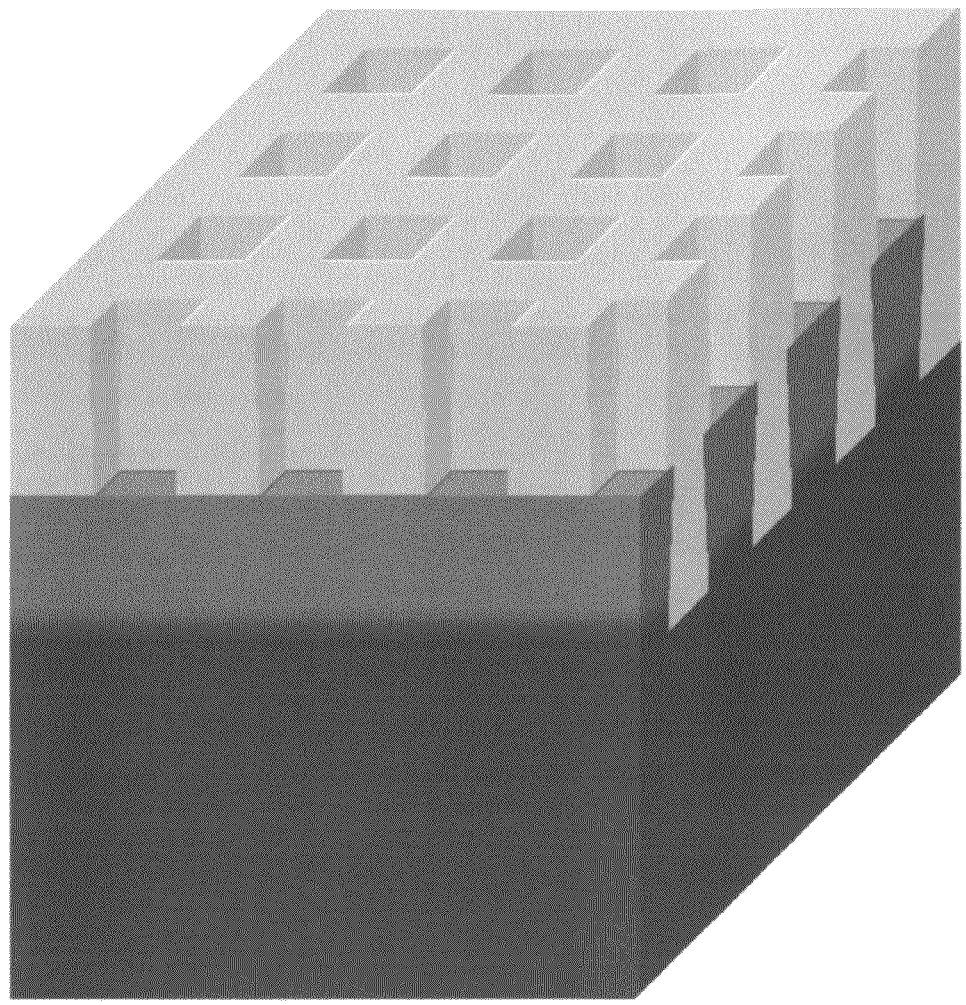
FIG. 7 is an exemplary drawing of a semiconductor surface following etching of the top terminal contacts in accordance with an embodiment of the invention.
Figure 8:
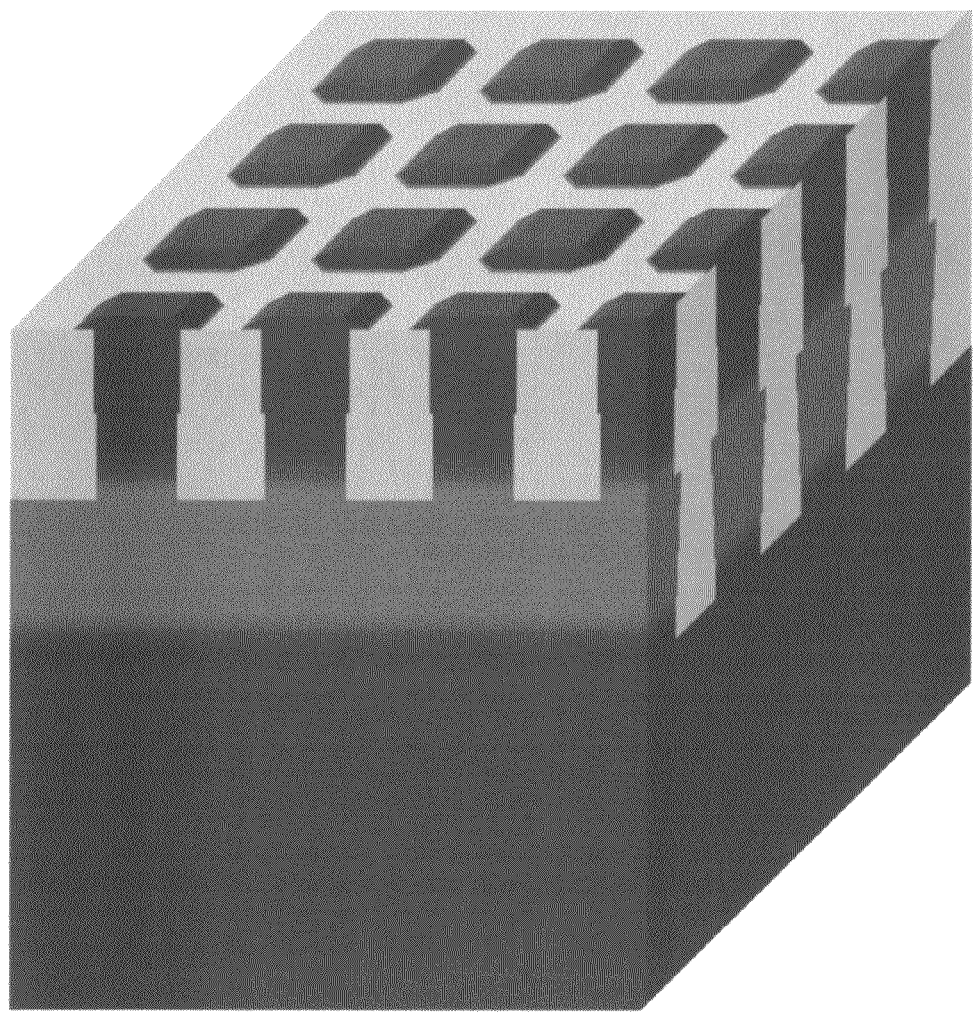
FIG. 8 is an exemplary drawing of a semiconductor surface following epitaxial growth of the top terminal contacts in accordance with an embodiment of the invention.
Figure 9:
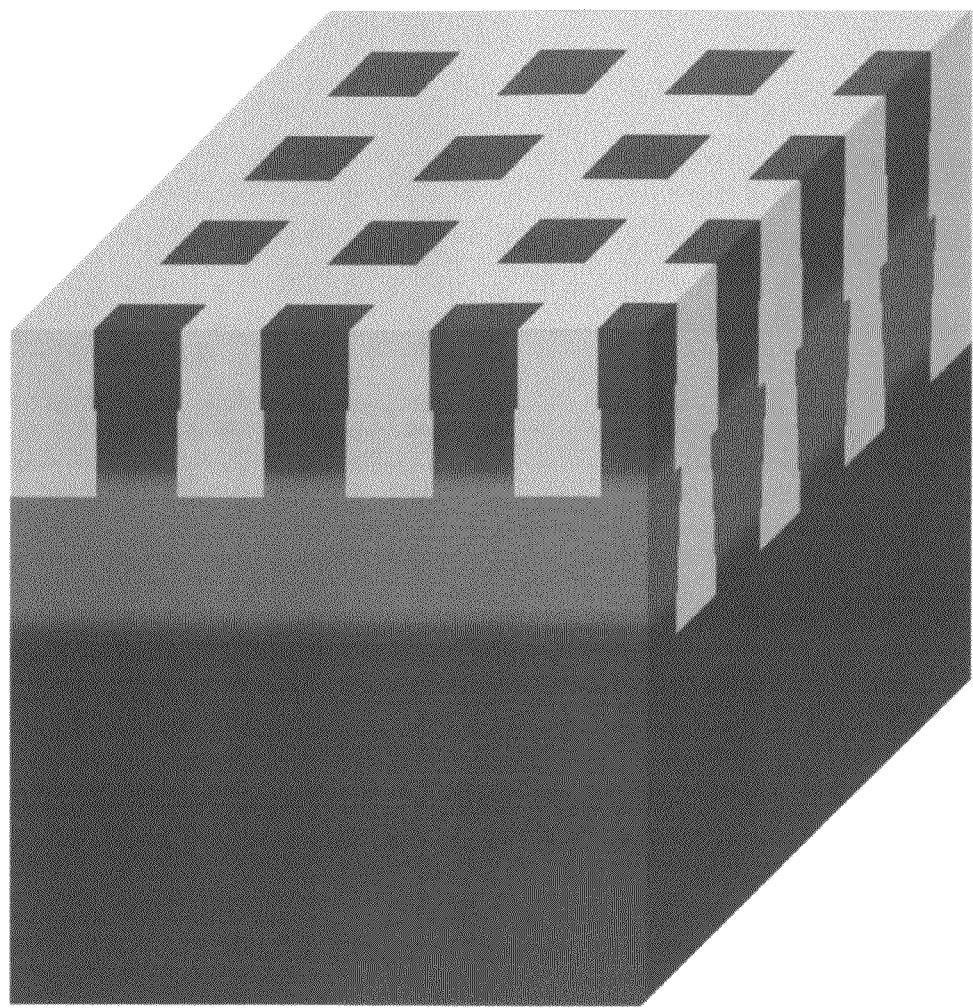
FIG. 9 is an exemplary drawing of a semiconductor surface following planarization in accordance with an embodiment of the invention.

Having formed the stripes of base material, another layer of dielectric material is deposited as depicted in FIG. 6. The thickness is approximately equal to the desired thickness of the top layer terminals of the transistors. If the bottom, common area is to be a common collector, then this layer will be the individual emitter terminals of the formed bipolar transistors. If the bottom, common area is to be a common emitter, then this layer will be the individual collector terminals of the formed bipolar transistors. Following the deposition of this second dielectric layer, holes are patterned and etched where the transistor's individual terminals are to be formed, as depicted in FIG. 7. These holes are etched to the surface of the underlying doped silicon base area (depicted in FIG. 5) so as to expose the surface of that doped silicon base stripes in the bottom of the holes. Silicon is now selectively epitaxially grown on the exposed silicon in the bottom of the holes as is commonly done by those skilled in the art and as is depicted in FIG. 8. FIG. 9 depicts the structure following planarization (as by CMP). As are well understood by those skilled in the art, doping profiles of the silicon (or other semiconducting materials) layers can be effected by in-situ doping, implanting, and/or the like and annealing steps, may also be performed along the way to activate any dopant atoms or improve performance.

Figure 10:
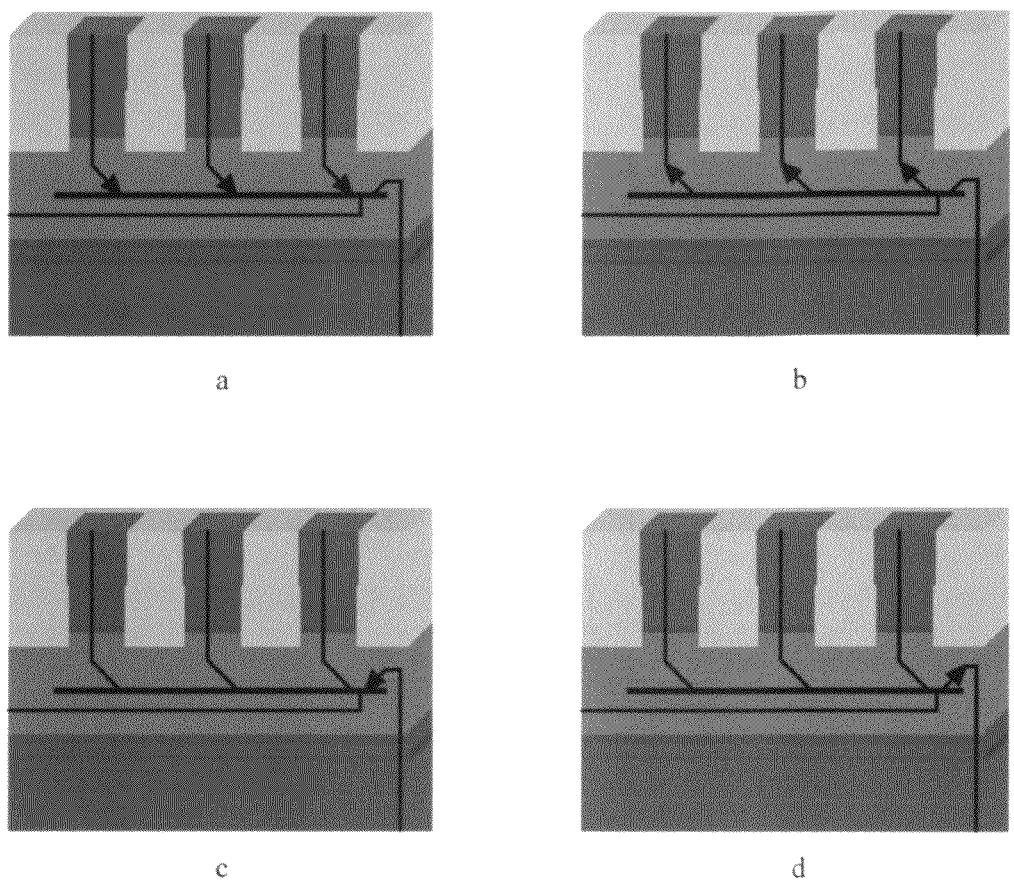
FIG. 10 is an exemplary drawing (in four parts) of transistors fabricated in accordance with an embodiment of the invention on which transistor schematics are superimposed to indicate four bipolar transistor types (clockwise from top left: common collector PNP, common collector NPN, common emitter NPN, and common emitter PNP).

At this point, an array of bipolar transistors will be formed having a single common bottom terminal, shared base terminals in parallel rows, and individual top terminals. FIG. 10 depicts the four transistor types. FIG. 10(a) depicts a row of PNP transistors having a common collector. FIG. 10(b) depicts a row of NPN transistors having a common collector. FIG. 10(c) depicts a row of PNP transistors having a common emitter.

A variation in the manufacture of the present invention will include forming the two dimensional array of switches by first creating three or more layers of alternating polarity doped semiconductor material by deposition or implantation and then etching a first plurality of spaces between rows of switches such that the etch stops upon or within the bottom layer (or, if there is an isolation layer below the structure, a low level layer that is to be the bottom, common contact) so as to separate in one dimension all but that bottom layer of the switches. Once this first etch is completed, a second etch is done to form a second plurality of spaces that are orthogonal to the first plurality of spaces such that the etch stops upon or within a layer that is below the top layer and above the bottom layer in which the first etch was stopped (or, if there is an additional layer on top for forming a better ohmic contact, stopping below a high level layer) such that said bottom layer is continuous among switches in two dimensions, the top (or high level) layer is isolated across switches in two dimensions, and the at least one intervening layer is continuous among switches in one dimension and isolated in the other dimension such that rows of control signal connections (such as a common bipolar base contact or common SCR gate contact) are formed.

Figure 11:
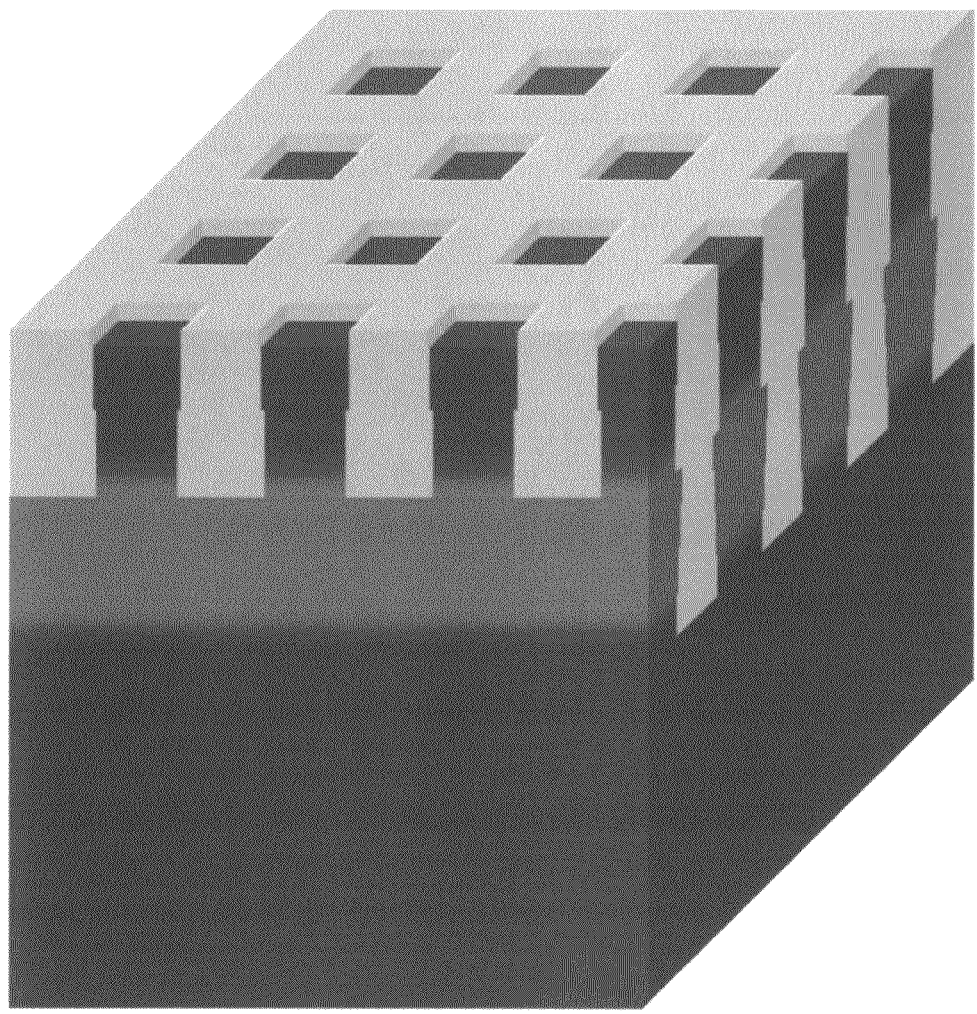
FIG. 11 is an exemplary drawing of a semiconductor surface following etch-back of the top terminal contacts in accordance with an embodiment of the invention.
Figure 15:
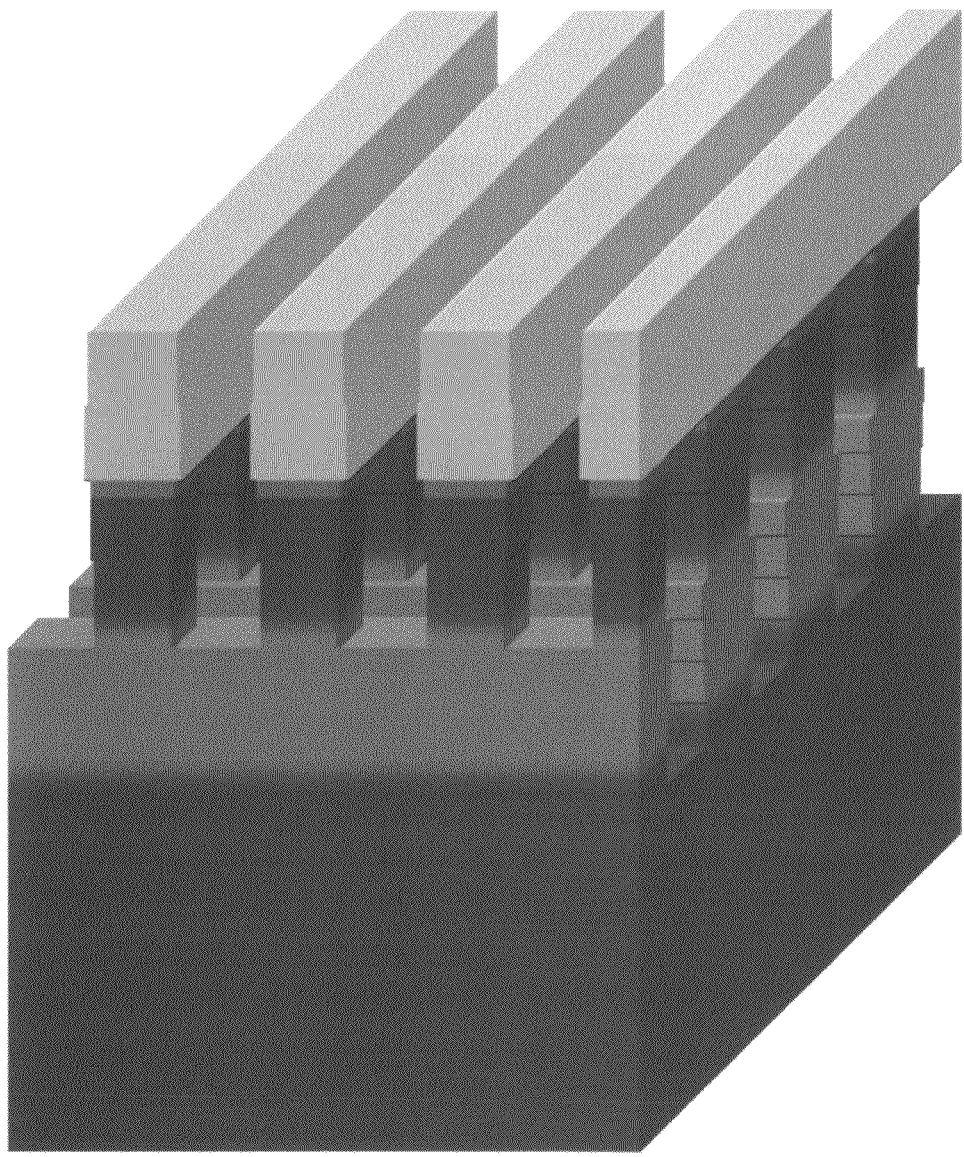
FIG. 15 is an exemplary drawing of a memory array constructed according to an embodiment of the invention showing the internal structure by hiding the dielectric layers material.

This array of transistors—or electronic switches—can be utilized as the switch selection mechanism for a memory array device, a display device, or any device utilizing an array of switches. As the switch array for a memory device such as a resistive array memory (including PCRAM utilizing a Chalcogenide alloy such as GST) or any other array memory in which the information storage element is a two-terminal element, the information storage element would be formed upon the individual top terminals. This can be done by etching back these individual top terminals (depicted in FIG. 11), depositing the information storage element material and then planarizing (depicted in FIG. 12), and then forming the top conductors orthogonal to the stripes of base material (depicted in FIG. 13); these top conductors can be formed in a variety of ways well understood by those skilled in the art including depositing the top conductor material and the patterning and etching to form the conductors. (Alternatively, these could be formed utilizing a damascene process, but care would have to be taken to expose the information storage element material in the bottom of the damascene trenches without damaging that material.) FIG. 15 depicts the underlying structure (as depicted in FIG. 13) with the dielectric material omitted for showing the internal structure.

Figure 14:
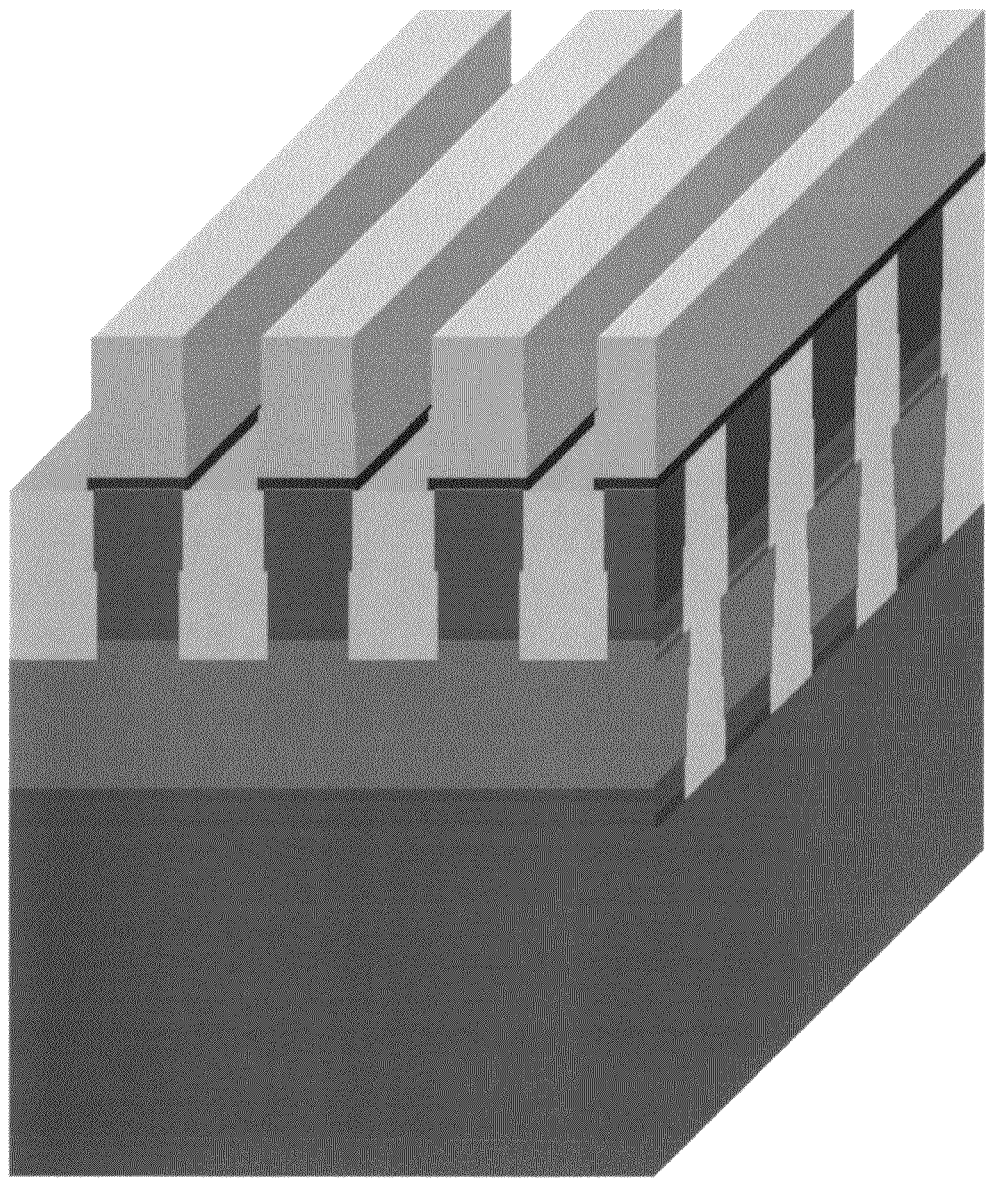
FIG. 14 is an exemplary drawing of a memory array constructed according to an embodiment of a variation of the invention showing an alternative formation of the programmable material.

An alternative for forming the information storage elements and top conductors includes processing the device from the point depicted in FIG. 9 by depositing a layer of information storage element material followed by a layer of top conductor material and then patterning and etching both layers of material together (depicted in FIG. 14). Other considerations include adding thickness to the deposited dielectric layers to allow for losses in thickness due to the planarization steps.

Figure 12:
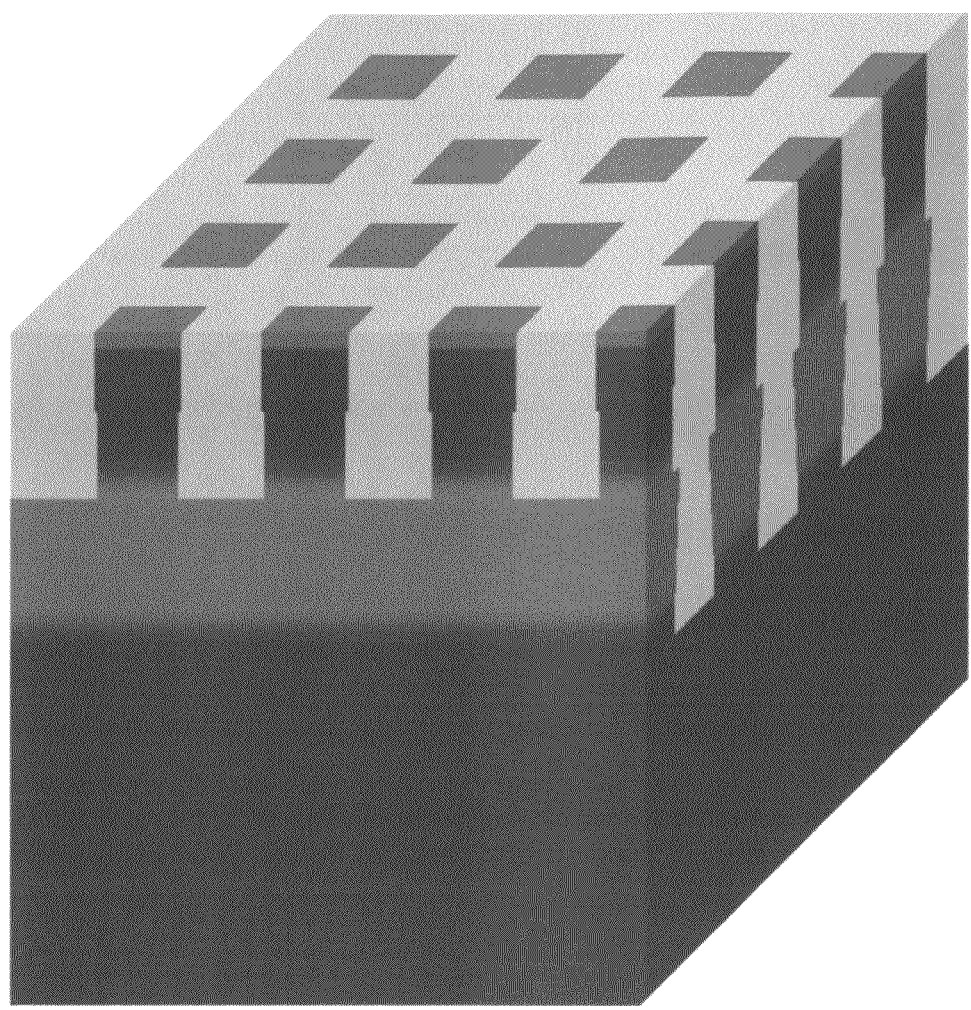
FIG. 12 is an exemplary drawing of a semiconductor surface following deposition and planarization of a programmable material in accordance with an embodiment of the invention.
Figure 13:
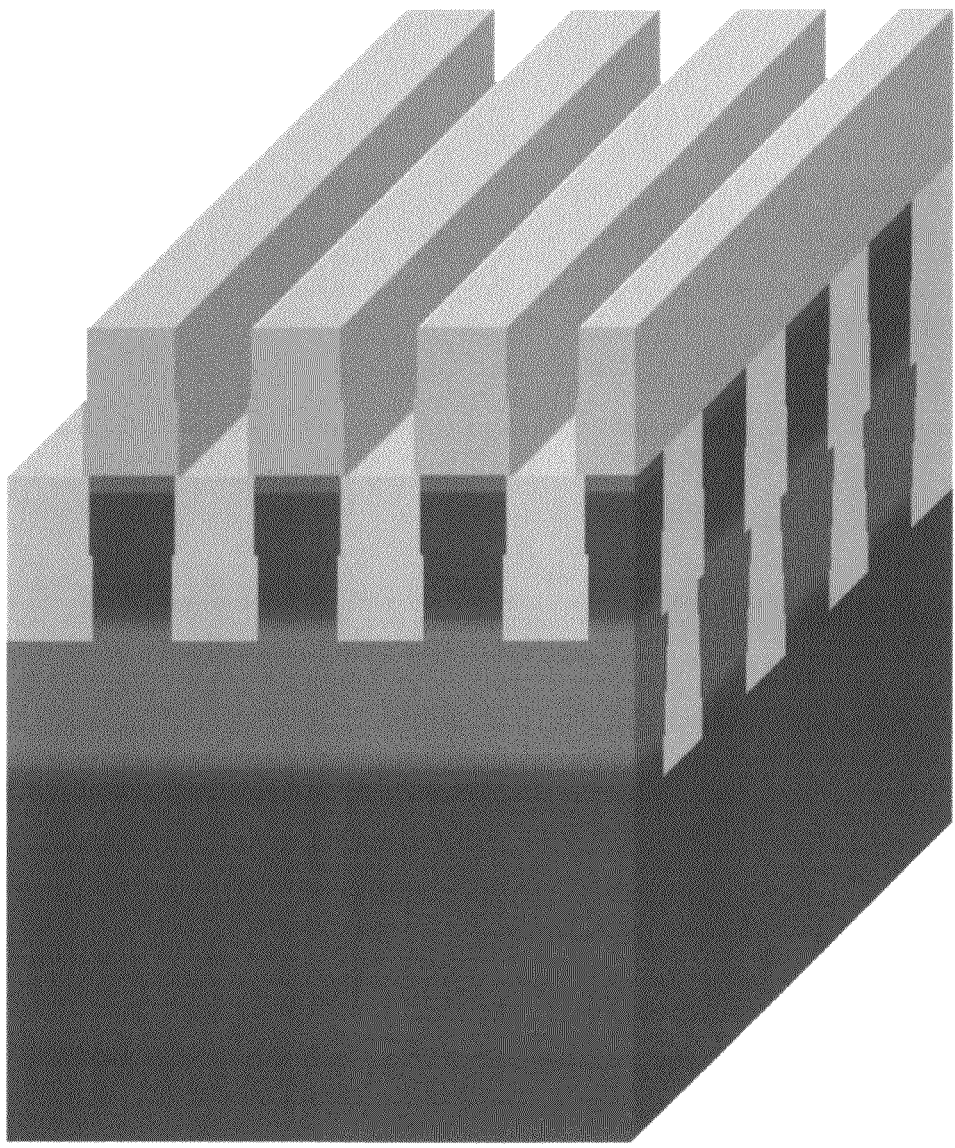
FIG. 13 is an exemplary drawing of a semiconductor surface following metal deposition, patterning and etch to define the top conductors in accordance with an embodiment of the invention.

When utilizing this array of transistors as the switch selection mechanism for a display device, the light emitting structures could be substituted for the information storage element material as depicted in FIG. 12. This could include organic light emitting diode material (OLED). A display device implementation could be enhanced by using a transparent top conductive material such as Indium-Tin-Oxide (ITO).

OPERATION

A few modes of operation of the present invention may come to mind for those skilled in the art. The first, as described above, is to energize the common bottom terminal and one shared base stripe while also energizing one (orthogonal) top conductor. For example, if the array is a plurality of PNP type transistors having a common collector on the bottom and individual emitters on top, the common collector bottom terminal could have ground potential applied to it and the one selected top conductor would have a potential of a volt or more (enough to forward bias the emitter-base junction of the targeted cell's transistor switch). All of the unselected shared base stripes would have a voltage applied that would cause all of the emitter-base junctions of the transistors connected thereto to be switched off. The one selected shared base stripe would have a voltage applied to it such that the transistor at the intersection of that selected top conductor and that selected shared base stripe would have its emitter-base junction forward biased and current would flow between the common bottom terminal and the top conductor (a small amount of current would also flow through the base terminal consistent with the Beta of the transistor switch as is understood by those skilled in the art).

In an alternate mode of operation, all of the unselected shared base stripes would have a voltage applied that would cause all of the emitter-base junctions of the transistors connected thereto to be zero biased or very slightly forward biased. This is a mode of operation disclosed in U.S. Provisional Patent Application 61/398,632.

Figure 16:
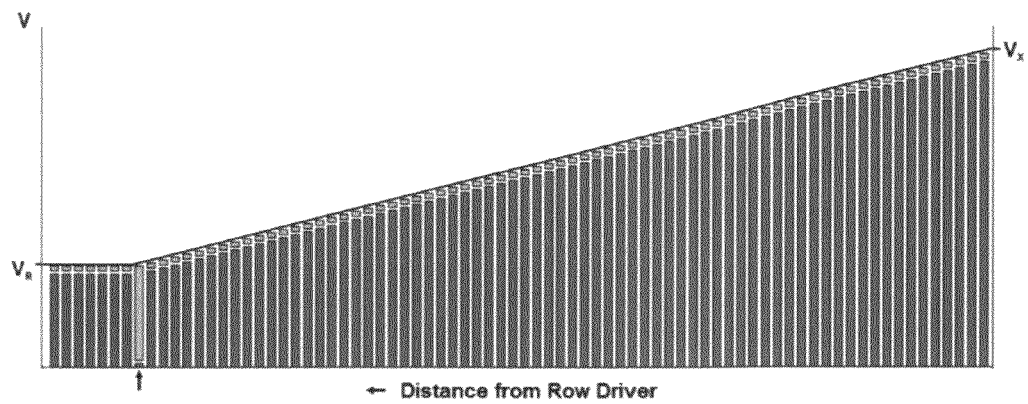
FIG. 16 is a graph depicting voltages on the columns and on a selected Row while reading when the selected column in farther from the row driver.

In this mode of operation, the switch is turned on at the selected cell to pull the potential to ground as described above while a voltage, $V_X$, is applied to the selected top conductor. For the sake of this explanation, we shall refer to the top conductor as the row and the switches that this row crosses over as the columns. Since the row has a finite resistance, there will be a voltage drop along the row from the Row Driver at the end of the row to the point along the row where it crosses the selected column that is sinking to ground. A graph of these voltages is shown in FIG. 16. In this graph, the Row Driver is on the right where $V_X$ is applied and the drop in that voltage is shown as the line extending from right to left having a downward slope to the selected column (shown by an upward pointing arrow below the x-axis). To the left of the selected column, this line is flat because there is no additional loading beyond the selected column. At the point of the selected column, the voltage across the information storage element is shown and is represented by the lighter gray bar where the height of the bar corresponds to the voltage across the element. [Note, the graph is representative of the voltages for the purpose of the present discussion but it does not represent actual scale.] The darker gray bar below the lighter gray bar represents the voltage at the top of the switch; here, the small bar would represent the voltage slightly above ground corresponding to the emitter-collector voltage. In this mode of operation, rather than have the unselected column switches switched off, the base of each stripe of switches is biased to a voltage corresponding to the voltage on the row at the point where that row crosses each column. In so doing, the voltage between the row at the point where it crosses any column and the base of the transistor switch corresponding to that column will be zero (i.e., the base voltage is set to match the voltage on the row at each column) and the switch (having its emitter-base junction zero-biased) will be switched off and no current will flow from the row to any of the unselected columns (i.e., as if the columns are not even present). Therefore, for all the unselected columns, the darker gray bar in the graph represents a voltage corresponding to the value experienced on the row at each column's respective crossing point and the small gray bar on top represents a voltage across the information storage element of approximately zero. It should be noted that with a zero potential across the information storage element of each of the unselected columns, the resistance value of those information storage elements is inconsequential.

Figure 17:
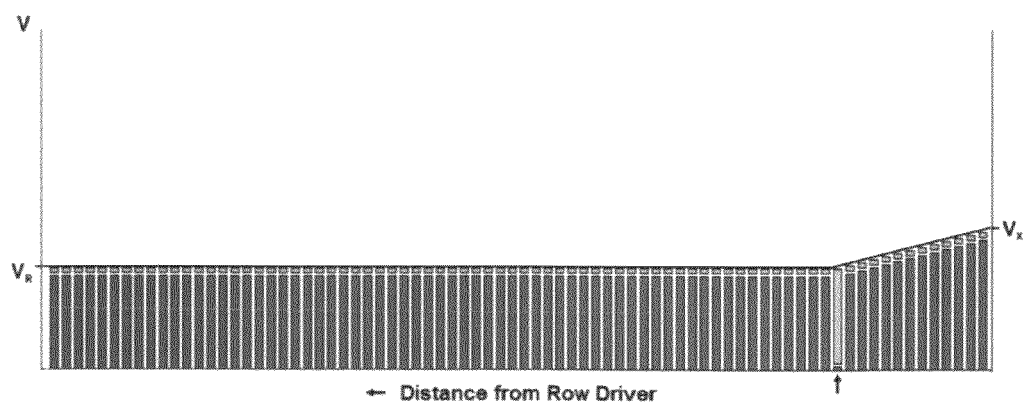
FIG. 17 is a graph depicting voltages on the columns and on a selected Row while reading when the selected column is closer to the row driver.

To read the information storage element at the targeted location, $V_X$ is set as a function of the distance away from the end of the row to the selected column such that the read voltage ($V_R$) occurs on the row at the point of intersection of the row with the selected column (as well as at every point from that selected column to the end of the row away from the row driver). If the selected column is closer to the row driver (i.e., closer to the right end of the row) as shown in FIG. 17, the applied voltage $V_X$ is correspondingly lowered such that $V_R$ remains at the same level. $V_X$ is determined using an assumption of the resistance value of the information storage element at the targeted memory cell. The slope of the line is a function of the resistance of the row and the current through that row and this current is a function of the resistance of the selected information storage element, among other things, and the information storage element has a range of resistance values—for a single level cell (SLC) this resistance value will be either high (about 100KΩ to 1MΩ) or low (about 10KΩ). Using an assumed resistance, $R_A$, value of 10KΩ and a desired read voltage $V_R$, the assumed current, $I_A$, through the device is computed by Ohm's Law ($I_A = V_R/R_A$) and, since the assumed resistance works in conjunction with the unselected column voltages being set such that no current flows from the row into any of the unselected columns, all of this current $I_A$ flows through the row to the row driver; this along with the resistance of the row, $R_R$, can be used to determine $V_X$ (where $V_X = I_A \times R_R + V_R$). If the resistance assumption proves to be incorrect for any given read operation, the voltage $V_R$ will turn out to be higher than that computed (and sensing this voltage $V_R$ factors into determining the data bit state). Since in the ideal case, the voltage across all of the unselected information storage elements is zero when the assumed resistance of the targeted information storage element is exactly right, those unselected elements could in theory have any resistance value from zero (a short circuit) to infinity (an opened circuit) because no current flows through them. But, if the actual resistance value for the targeted element is greater than the assumed resistance value, the actual voltage $V_R$ will be greater than the computed voltage $V_R$ (by how much greater is a function of the loading by the unselected elements, but $V_R$ will never be lower than the computed value). If actual voltage $V_R$ is much greater than the calculated voltage $V_R$, then both the selected element must be higher than its assumed resistance value and the loading by the unselected elements must be low (i.e., the data bit state is known). However, if the actual voltage $V_R$ is about equal to the calculated voltage $V_R$ (leakage currents will typically keep the voltage from being exact), then either the selected information storage element is in the assumed resistance state or the selected element is in the opposite state but the unselected elements are heavily loading the row line (i.e., the data bit state is ambiguous). Since the unselected information storage elements are all biased by columns that are set to voltages that are equal to or greater than $V_R$, then there must be significant loading and the current flowing through the unselected elements must be greater than when the current is only flowing through the selected element (when its resistance is as was assumed in which case no current would be flowing through the unselected elements—the data bit state, with the inclusion of a current measurement, is not ambiguous). Finally, when $V_X$ is close to $V_R$ (i.e., when the selected column is close to the row driver end of the row), there can be little loading by the unselected elements and presence the current flowing would indicate that the selected element is in the assumed low resistance state as assumed.

It is preferable to select a read voltage $V_R$ such that the highest value for $V_X$ (because of the slope of the line, $V_X$ is greatest when the selected column is at the opposite end of the row from the row driver) will not cause a "read disturb" should the entire $V_X$ be placed across an information storage element (e.g., the storage element closest to the row driver), but, particularly in arrays with very long rows, this may not always be possible.

Figure 18:
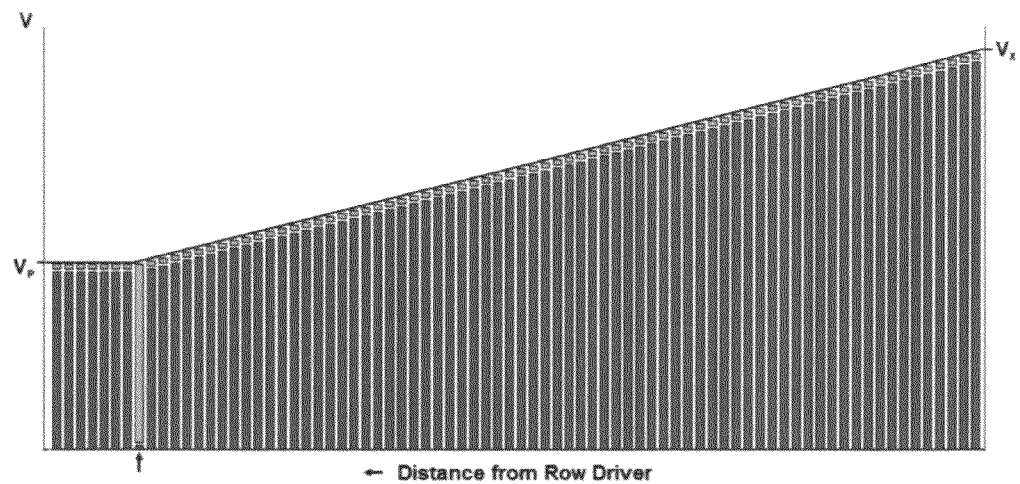
FIG. 18 is a graph depicting voltages on the columns and on a selected Row while erasing.
Figure 19:
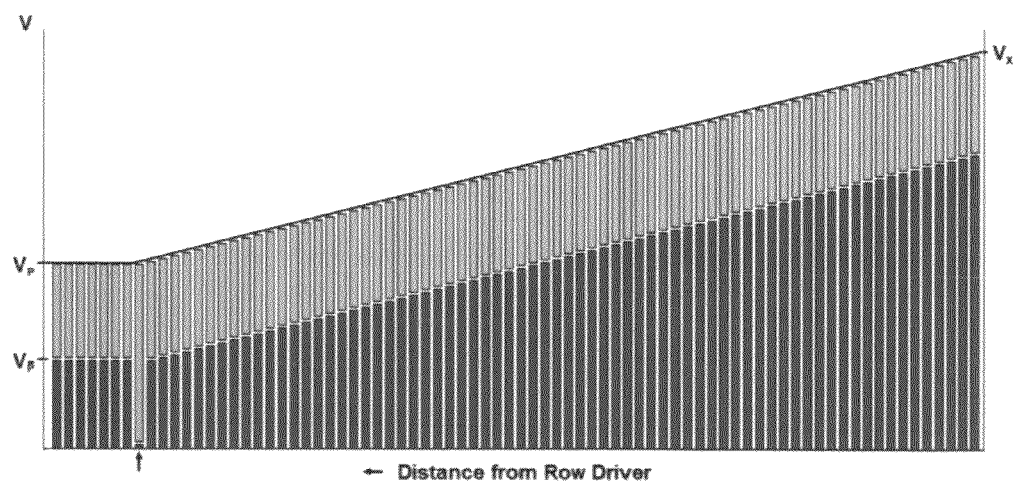
FIG. 19 is a graph depicting voltages on the columns and on a selected Row while programming in a three-dimensional array.

When programming a memory cell, operation proceeds in the same manner, except that the voltage $V_R$ is increased to a programming voltage level, $V_P$ (see FIG. 18). As is depicted in this graph, the voltage across the memory elements at the unselected columns remains small because the bias voltages on these unselected columns are correspondingly raised along with $V_P$ (however, the unselected column bias voltages can be reduced to save power, as depicted in FIG. 19, as long as the voltage across the unselected memory elements does not exceed the threshold for programming).

In both reading and programming, on the unselected rows, a lower row voltage (typically ground or near ground, but below the $V_f$ for the emitter base junction, to prevent the emitter-base junction where a deselected row intersects the selected column from being forward biased) is applied to deselect those rows which, because of the biasing voltages applied to the base side of the switch junctions of the columns, will reverse bias the emitter base junctions of all the unselected rows.

Figure 20:
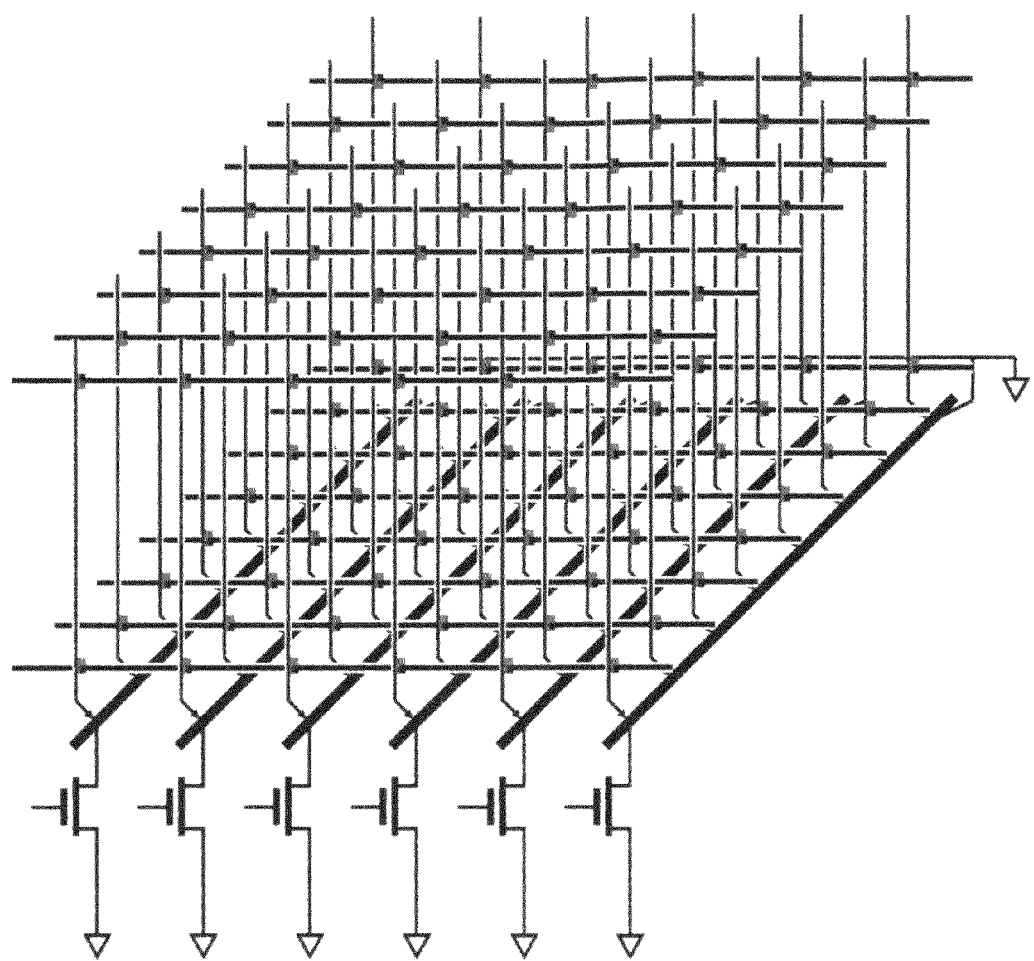
FIG. 20 is an exemplary drawing of a three-dimensional array circuit in accordance with an embodiment of the invention.
Figure 21:
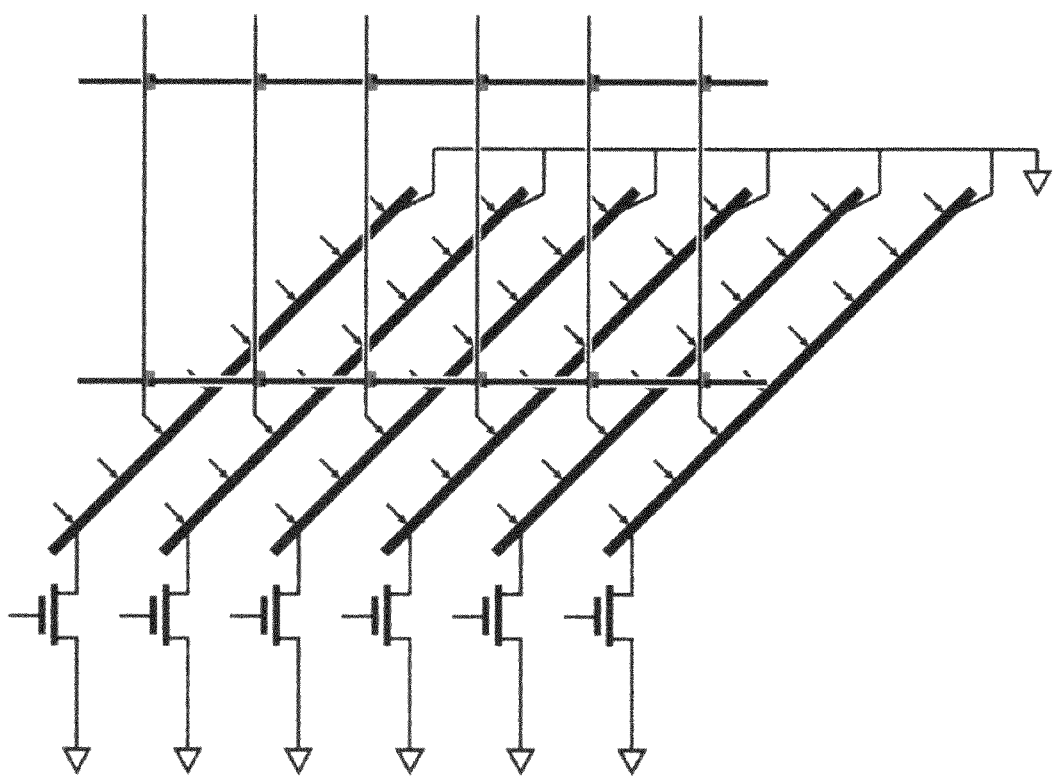
FIG. 21 is an exemplary drawing of a three-dimensional array circuit in accordance with an embodiment of the invention showing one vertical plane (fence).

The present invention is well suited for use with a three-dimensional array, such as is described in U.S. patent application Ser. No. 13/135,235 for a three-dimensional resistive array. In such an application, as depicted in FIG. 20 showing two layers, the columns (base line conductors in the "y" direction) are perpendicular to the conductive lines (in the left-right or "x" direction) in the layers of the three-dimensional structures. Each set of vertically stacked conductive lines (i.e., one conductive line in the "x" direction from each vertical plane where all the conductive lines are stacked one above each other) form a vertical plane and share a set of vertical "posts" emanating from the top of each of the array switches in that same vertical plane; each vertical plane is referred to as a "fence" and all the fences are electrically separate from each other except for the shared unified switch array switches at the bottom of the fence. As such, and because the connections to the unified switch array below the layers all provide a low impedance connection, cross-talk between any two fences is minimal and each fence can be analyzed independent of the others. FIG. 21 depicts the same view as FIG. 20, except that only the third fence is shown. (FIGS. 20 and 21 correspond to the physical construction depiction of FIG. 15, except in FIG. 15 the substrate is rotated 90 degrees and only a single layer is shown.)

With a three-dimensional structured resistive array, each information storage element could be formed in series with a voltage threshold device such as an Ovonic Threshold Switch (OTS) to improve the noise margin.

VARIATIONS

Many other alternate embodiments of the present invention will come to mind for those skilled in the art. The manufacturing and operating techniques described herein could also be used for four-layer diodes (i.e., thrystors or the like) or other switching devices (e.g., SCR's, diacs or the like). The transistor could be utilized such that the emitter is the common terminal as opposed to the collector (but, this could result in a less efficient use of power). The resistivity of the base conductor could be reduced by having a parallel metal strapping conductor above the semiconductor conductor with periodic or occasional via connections. Connection to the common bottom terminal could be through a back-side contact or through one or more openings formed to that common terminal from the front side. The techniques described herein could be used for other than memory arrays and could be used for a variety of circuits whether or not they have an array form and arrayed devices could include display devices. The switch array described herein could be used for an array of sensors (for example, a contact on top of the cells could have an air-gap between it and an energized conductive diaphragm above it such that a pressure switch is achieved whereby when the metal diaphragm is depressed it contacts one or more of the contacts on top of the cells to selectively complete a current path through one of more of the cells).

Figure 22:
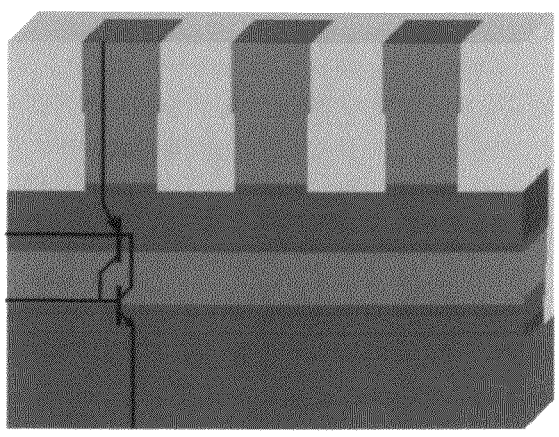
FIG. 22 is an exemplary drawing of a memory array constructed according to a variation of an embodiment of the invention in which the array utilizes thrysistors instead of transistors at each switch location.
Figure 22:
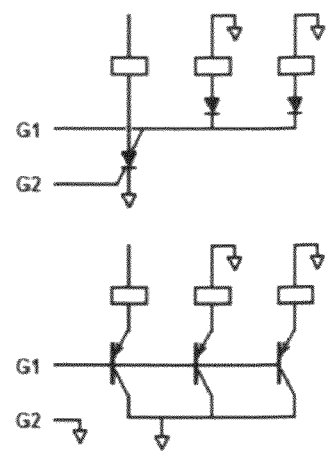

Another variation is to form an array of thrysistors or SCR's having a single common bottom terminal, shared gate terminals in parallel rows (in what was the base terminals as shown in FIG. 10, accomplished by reversing the doping at approximately half way up that layer), and individual top terminals (which must now be doped to the opposite type). FIG. 22 depicts a row of SCR's according to this variation; the schematics on the right depict the two modes of operation (a selected row, above, and a non-selected row, below). Fabrication of the SCR array according to this variation is performed very much in the same way as the bipolar transistor implementation described above except the formed structure has a common N-type terminal on the bottom, P-type below N-type in the middle stripes (in what was a stripe of a single type of material for the bipolar transistor implementation), and individual terminal points of P-type on top. Doping the middle stripes region is apparent to those skilled in the art and could be performed while the middle region is being deposited (such as by in-situ dopant reversal after about half of the material is deposited) or after the middle region is fully deposited (such as by implantation) or by starting with a substrate having layers of N, P and N (into which the stripes are formed by etching, deposition of dielectric fill and then polishing, as will be clear to those skilled in the art); if etching the stripes, it is acceptable to have the etch extend into the bottom N layer to assure the stripes of P-type material are fully separated. As will be clear to those skilled in the art, the middle layer construction could be extended along the same lines to include more than two layers for ever more complex switching devices. In operation, the selected row (upper schematic) would behave as an SCR at the selected column (on the left) and at each other unselected (grounded) column would simply be a diode with a near-zero, slightly reverse biased diode (gate connection G1 would be allowed to float and self-bias whereas G2 would initially be grounded and then it would either float or be asserted slightly positive to trigger the SCR effect after which G2 could be allowed to float as well). This would enable the selected cell to have a highly conductive path from the top terminal to the grounded, low resistance bottom terminal. The unselected rows (lower schematic) would have their lower gate G2 connections grounded and, since the bottom terminal can be ignored because it is also grounded, results in an effective PNP voltage follower where gate terminal G1 would act as the reference voltage input and gate terminal G2 would act as a ground terminal to the common collector; those cells on the unselected rows at the crossings of the unselected (grounded) columns would have their base-emitter junctions slightly reverse biased and those PNP's would be switched off while the one cell at the crossing with the selected column would follow the reference voltage on G1. The common collector of the unselected rows would have a non-negligible resistance, but these voltage followers should have a low current requirement in so much as they are designed to provide a voltage match to the voltage where they cross the selected column.

Embodiments of the present invention will typically, though not necessarily, be built as integrated circuits by means of photolithography. Embodiments may be implemented with a traditional two dimensional arrangement of storage elements or with a three-dimensional arrangement of storage elements. The storage elements may include a fuseable material, an antifuseable material, a phase-change material (for PRAM) such as a chalcogenide alloy material (including a chalcogenide in which the programmed resistivity may be one of two resistance values and, in the case of more than one bit per cell storage cells, in which the programmed resistivity may be one of three or more resistance values), a resistive change material (for RRAM), a ferroelectric material (for FRAM), a magnetic or magnetoresistive material (for MRAM), magnetic tunnel junction or spin-transfer torque element (for MTJ-RAM or STT-RAM), a dual layer oxide memory element comprising a junction and an insulating metal oxide and a conductive metal oxide (see U.S. Pat. No. 6,753,561 by Rinerson), or a trapped charge device (see U.S. Pat. No. 7,362,609 by Harrison, et al). The phase-change material, such as a Chalcogenide material, may be programmed or erased. Orientation of the array may be rotated, i.e., the "rows" may be "columns," or vice versa. The polarity of the voltages and direction of the steering elements in the storage bits may be reversed while still keeping within what is envisioned by embodiments of the present invention. The present invention may be applied to other memory technologies as well including static RAM, Flash memory, EEPROM, DRAM, and others not mentioned, including memory technologies yet to be commercialized or invented.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among a plurality of host devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chipsets or other custom or standard circuitry.

The terms and expressions employed herein are used as terms and expressions of description and not of limitation, and there is no intention, in the use of such terms and expressions, of excluding any equivalents of the features shown and described or portions thereof. The present disclosure has been simplified at points for the sake of clarity, but these simplifications will be well understood by those skilled in the art. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A two dimensional array of switches comprising three or more layers of alternating polarity doped semiconductor material whereby the bottom layer is continuous among switches in two dimensions, the top layer is isolated across switches in two dimensions, and at least one intervening layer is continuous among switches in one dimension and isolated in the other dimension.

2. The array of switches of claim 1 whereby the bottom common contact has low resistance.

3. The array of switches of claim 1 whereby the layers within a given switch cooperate to form a vertical transistor.

4. The array of switches of claim 3 whereby the transistors are the bipolar type.

5. The transistors of claim 4 whereby said transistors have sufficient gain to allow operation when the center common contact has moderate or high resistance.

6. The array of switches of claim 1 whereby the layers within a given switch cooperate to form four-layer diodes or SCR's.

7. The switches of claim 6 whereby the four-layer diodes or SCR's have sufficient gain to allow operation when the center common contact(s) has moderate or high resistance.

8. The switches of claim 1 whereby a reference voltage is applied a middle layer of some of the switches in the array.

9. The array of switches of claim 1 whereby the switches are operated to select a memory cell in a memory device.

10. The array of switches of claim 1 whereby the switches are operated to select a pixel cell in a display device.

11. The array of switches of claim 1 whereby the switches are operated to select a sensing cell in a sensor device.

12. A semiconductor memory device comprising a two dimensional array of switches fabricated out of three or more layers of alternating polarity doped semiconductor material whereby the bottom layer is continuous among switches in two dimensions, the top layer is isolated across switches in two dimensions, and at least one intervening layer is continuous among switches in one dimension and isolated in the other dimension.

13. The memory device of claim 12 wherein at least one storage location is programmed with data comprising at least one of music, video, computer software, a computer application, reference data, text, or a diagram.

14. The memory device of claim 12 wherein the device is disposed within a package that is removable and interchangeable among a plurality of host devices.

15. The memory device of claim 12 wherein bit information is retained at a given memory cell by a phase-change material.

16. The memory device of claim 15 wherein the phase-change material is a Chalcogenide alloy.

17. The memory device of claim 12 wherein bit information is retained at a given memory cell by a magnetic or magnetoresistive material.

18. The memory device of claim 12 wherein bit information is retained at a given memory cell by utilizing a magnetic tunnel junction or spin-transfer torque element.

19. The memory device of claim 12 wherein bit information is retained at a given memory cell by utilizing a fuse or antifuse material.

20. A method for forming a two dimensional array of switches comprising the steps of (i) creating three or more layers of alternating polarity doped semiconductor material by deposition, epitaxial growth and/or implantation, (ii) performing a first etch to form a first plurality of spaces between rows of switches such that the etch stops upon or within a low level layer, (iii) performing a second etch to individually define the tops of each switch such that the bottom of said second etch stops upon or within a layer that is below a high level layer and above said low level layer, such that said low level layer is continuous among switches in two dimensions, the high level layer is isolated across switches in two dimensions, and at least one intervening layer is continuous among switches in one dimension and isolated in the other dimension.

* * * * *